(12) United States Patent
Bamiere et al.

(10) Patent No.: US 8,021,568 B2
(45) Date of Patent: Sep. 20, 2011

(54) NICKEL-MOLYBDENUM-DOPED LEAD ZIRCONATE TITANATE, METHOD FOR THE PRODUCTION OF A PIEZOCERAMIC COMPONENT USING SAID LEAD ZIRCONATE TITANATE, AND USE OF THE PIEZOCERAMIC COMPONENT

(75) Inventors: Francois Bamiere, Mannheim (DE); Katrin Benkert, München (DE); Stefan Denneler, München (DE); Morgane Radanielina, Strasbourg (FR); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 581 days.

(21) Appl. No.: 12/094,199

(22) PCT Filed: Dec. 18, 2006

(86) PCT No.: PCT/EP2006/069811
§ 371 (c)(1),
(2), (4) Date: May 19, 2008

(87) PCT Pub. No.: WO2007/074095
PCT Pub. Date: Jul. 5, 2007

(65) Prior Publication Data
US 2008/0245991 A1 Oct. 9, 2008

(30) Foreign Application Priority Data
Dec. 22, 2005 (DE) .................. 10 2005 061 529

(51) Int. Cl.
*C04B 35/491* (2006.01)
*H01L 41/24* (2006.01)
*H01L 41/187* (2006.01)

(52) U.S. Cl. .................. 252/62.9 PZ; 501/134; 501/136

(58) Field of Classification Search ........... 252/62.9 PZ; 501/134, 136; 427/100; 310/363, 364
See application file for complete search history.

(56) References Cited

U.S. PATENT DOCUMENTS

| | | | |
|---|---|---|---|
| 6,230,378 B1 * | 5/2001 | Cramer et al. | 29/25.35 |
| 2002/0098333 A1 | 7/2002 | Feltz et al. | 428/210 |
| 2006/0251911 A1 | 11/2006 | Feltz et al. | 428/457 |

FOREIGN PATENT DOCUMENTS

| | | |
|---|---|---|
| EP | 0 328 290 B1 | 9/1992 |
| EP | 1 580 180 A1 | 9/2005 |
| JP | 2005-82424 A | 3/2005 |
| WO | WO 01/45138 A | 6/2001 |

OTHER PUBLICATIONS

International Search Report PCT/EP2006/069811, 6 pages, May 6, 2007.

* cited by examiner

*Primary Examiner* — Carol M Koslow
(74) *Attorney, Agent, or Firm* — King & Spalding L.L.P.

(57) ABSTRACT

A piezoceramic composition of a calculated empirical formula $Pb_{1-a}RE_bAE_c[Zr_xTi_y(Ni_nMo_m)_z]O_3$, wherein RE represents a rare earth metal having a rare earth metal content b, AE represents an alkaline earth metal having an alkaline earth metal content c, nickel is provided with a nickel content n.z, and molybdenum is provided with a molybdenum content m.z. Furthermore, the following correlations apply: $a<1$; $0=b=0.15$; $0=c=0.5$; $n>0$; $m>0$; $0.1=n/m=5$; $x>0$; $y>0$; $z>0$, and $x+y+z=1$. In a method for producing a piezoceramic component a) a green ceramic member containing the piezoceramic composition is supplied; and b) the green member is subjected to a thermal treatment such that the piezoceramic material of the component is produced from the piezoceramic composition. The thermal treatment encompasses calcining and/or sintering of the piezoceramic composition. The piezoceramic composition is compressed below 1000° C., thus allowing metals melting at a lower temperature to be sintered along with the piezoceramic composition.

10 Claims, 2 Drawing Sheets

NICKEL-MOLYBDENUM-DOPED LEAD ZIRCONATE TITANATE, METHOD FOR THE PRODUCTION OF A PIEZOCERAMIC COMPONENT USING SAID LEAD ZIRCONATE TITANATE, AND USE OF THE PIEZOCERAMIC COMPONENT

CROSS-REFERENCE TO RELATED APPLICATIONS

This application is a U.S. national stage application of International Application No. PCT/EP2006/069811 filed Dec. 18, 2006, which designates the United States of America, and claims priority to German application number 10 2005 061 529.5 filed Dec. 22, 2005, the contents of which are hereby incorporated by reference in their entirety.

TECHNICAL FIELD

The invention relates to a piezoceramic composition with a calculated empirical formula of a lead zirconate titanate (Pb(Ti,Zr)O$_3$, PZT). Also disclosed are a method for producing a piezoceramic component using the piezoceramic composition, and a use of the piezoceramic component.

BACKGROUND

Lead zirconate titanate is a perovskite, wherein the A sites of the perovskite are occupied by bivalent lead (Pb$^{2+}$) and the B sites of the perovskite are occupied by tetravalent zirconium (Zr$^{4+}$) and tetravalent titanate (Ti$^{4+}$). PZT is doped in order to influence an electrical or piezoelectric property such as permittivity, Curie temperature, coupling factor or piezoelectric charge constant (d$_{33}$ coefficient, for example).

A piezoceramic component in the form of a monolithic multilayer actuator is known from EP 0 894 341 B1. The multilayer actuator consists of a plurality of piezoelectric elements arranged one on top of the other to form a monolithic stack. Each of the piezoelectric elements has an electrode layer, a further electrode layer and a piezoceramic layer disposed between the electrode layers. Piezoelectric elements adjacent to one another in the stack each have a common electrode layer. The electrode material of the electrode layers consists of a silver-palladium alloy. The piezoceramic layers have a piezoceramic material made of PZT. The calculated empirical formula of the piezoceramic material is Pb$_{0.99}$Ag$_{0.01}$La$_{0.01}$[Zr$_{0.30}$Ti$_{0.36}$(Ni$_{1/3}$Nb$_{2/3}$)$_{0.34}$]O$_3$, as follows. A piezoceramic powder of the nominal composition Pb$_{0.99}$La$_{0.01}$[Zr$_{0.30}$Ti$_{0.36}$(Ni$_{1/3}$Nb$_{2/3}$)$_{0.34}$]O$_{3.005}$ is produced in accordance with known methods. Green films are prepared therefrom, provided with electrode material, layered to form the corresponding stacks, laminated and sintered under identical conditions. A piezoelectric actuator of high strength is obtained, for which a Curie temperature of 170° C. is determined. This actuator can therefore be used in a temperature range up to a maximum of about 80° C. This piezoceramic or, respectively, the piezoelectric actuator of multilayer design produced from it, possesses a complex doping with nickel and niobium for the B-site, as can be seen from the formula.

The composition of the piezoceramic material resulting from the sintering process is stoichiometric. The stoichiometry is a result of the fact that in the course of the sintering excess lead escapes in the form of lead oxide (PbO). Excess heterovalent lanthanum present is compensated by the inward diffusion of silver from the electrode material into the A sites of the PZT.

The resulting multilayer actuator is characterized by good piezoelectric properties. For example, the Curie temperature T$_c$ is approximately 170° C. That said, however, the sintering temperature required in order to obtain the good piezoelectric properties is in excess of 1100° C. In order to avoid fusing of the electrode material at these high sintering temperatures the palladium content of the electrode material must be at least 30 weight %.

For reasons of cost it is desirable to reduce the palladium content of the electrode material or to use generally cheaper electrode material such as copper or pure silver. Each of these metals has a melting point below 1100° C. This means that the sintering temperature must be lowered. The known piezoceramic composition is not suitable for compressing at a sintering temperature of less than 1100° C. The improved piezoelectric properties are not achieved at such a low sintering temperature.

SUMMARY

According to various embodiments, a piezoceramic composition compresses at a sintering temperature of less than 1100° C. and lends itself to being processed into a piezoceramic material which has similar or better piezoelectric properties in comparison with conventional piezoceramic compositions.

According to one embodiment, a piezoceramic composition may comprise a calculated empirical formula Pb$_{1-a}$RE$_b$AE$_c$[Zr$_x$Ti$_y$(Ni$_n$Mo$_m$)$_z$]O$_3$, wherein RE is a rare earth metal with a rare earth metal content b, AE is an alkaline earth metal with an alkaline earth metal content c, nickel is present with a nickel content n·z, molybdenum is present with a molybdenum content m·z, and wherein: a<1; 0≦b≦0.15; 0≦c≦0.5; n>0; m>0; 0.1≦n/m≦5; X>0; Y>0; Z>0; x+y+z=1.

According to a further embodiment, the following may apply: 0.5≦n/m≦2. According to a further embodiment, the following may apply: n/m=1. According to a further embodiment, the following may apply: n=m=0.5. According to a further embodiment, the following may apply: 0.005≦c≦0.1. According to a further embodiment, the following may apply: 0.005≦b≦0.15. According to a further embodiment, the following may apply: 0.001≦z≦0.5. According to a further embodiment, the following may apply: 0.001≦z≦0.05. According to a further embodiment, the rare earth metal RE may be at least one metal selected from the group consisting of europium, gadolinium, lanthanum, neodymium, praseodymium, promethium and samarium. According to a further embodiment, the alkaline earth metal AE may be at least one metal selected from the group consisting of calcium, strontium and barium.

According to another embodiment, a method for producing a piezoceramic component having such a piezoceramic material may comprise the following method steps: a) provision of a green body having the piezoceramic composition and b) heat treatment of the green body, the piezoceramic material of the component being produced from the piezoceramic composition.

According to a further embodiment, the green body may be provided by mixing powdered, oxidic metal compounds of the metals lead, rare earth metal RE, alkaline earth metal AE, zirconium, titanium, nickel and molybdenum to produce the piezoceramic composition. According to a further embodiment, a piezoceramic composition may have at least one mixed oxide comprising at least two of the metals is used. According to a further embodiment, a piezoceramic component may have at least one piezoelectric element is produced which has an electrode layer comprising electrode material, at least one further electrode layer comprising a further electrode material, and at least one piezoceramic layer arranged between the electrode layers and having the piezoceramic material. According to a further embodiment, a piezoelectric element may be used in which the electrode material and/or the further electrode material have/has at least one elementary metal from the group comprising silver, copper and palladium. According to a further embodiment, a piezoelectric element may be used in which the electrode material and/or the further electrode material have/has a palladium content which is chosen from the range from 0 weight % inclusive to 30 weight % inclusive and in particular from the range from 0 weight % inclusive to 20 weight % inclusive. According to a further embodiment, a palladium content of max. 5 weight % may be used. According to a further embodiment, the piezoceramic component having the piezoelectric element may be selected from the group consisting of piezoceramic flexural transducer, piezoceramic multilayer actuator, piezoceramic transformer, piezoceramic motor and piezoceramic ultrasonic transducer.

According to yet another embodiment, a method may use a piezoceramic multilayer actuator produced according to the above method for controlling a fuel injection valve of an internal combustion engine.

BRIEF DESCRIPTION OF THE DRAWINGS

The invention is described in more detail below with reference to a number of examples and the associated figures. The figures are schematic and do not represent true-to-scale illustrations.

DETAILED DESCRIPTION

Figure 1:
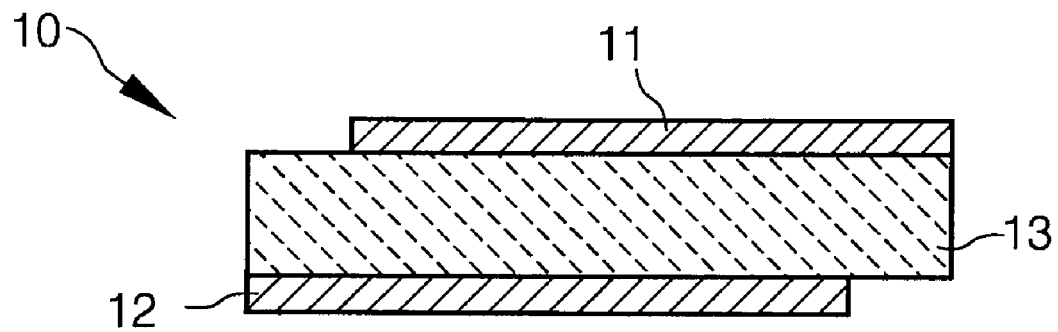
FIG. 1 shows, in a side cross-section, a ceramic piezoelectric element having a piezoceramic material which was produced with the aid of the piezoceramic composition.
Figure 2:
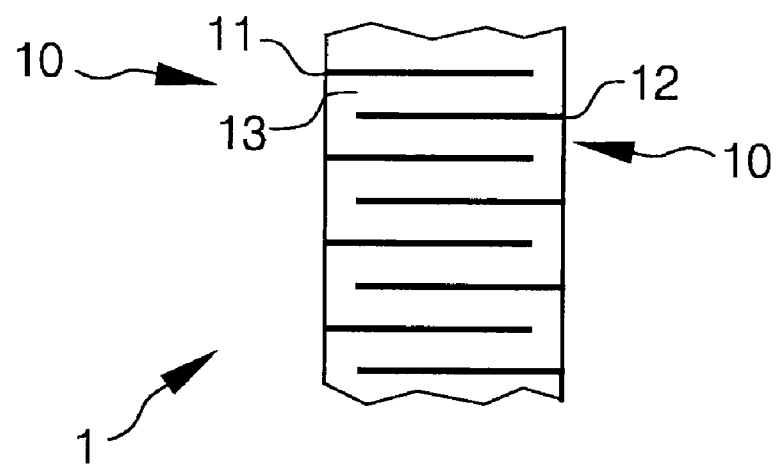
FIG. 2 shows, in a side cross-section, a piezoceramic component having a plurality of piezoelectric elements.

According to an embodiment, a piezoceramic composition may have a calculated empirical formula of $Pb_{1-a}RE_bAE_c[Zr_xTi_y(Ni_nMo_m)_z]O_3$, where RE is a rare earth metal with a rare earth metal content b and AE is an alkaline earth metal with an alkaline earth metal content c. Nickel is present with a nickel content n·z and molybdenum with a molybdenum content m·z. In addition the following correlations apply:

$a<1$ $0 \leq b \leq 0.15$ $0 \leq c \leq 0.5$ $n>0$ $m>0$ $0.1 \leq n/m \leq 5$ $X>0$ $Y>0$ $Z>0$ $x+y+z=1$.

The specified contents are molar contents. n/m specifies the ratio of the molar contents of nickel and molybdenum.

According to a further embodiment, a method for producing a piezoceramic component with a piezoceramic material using such a piezoceramic composition, may comprise the following method steps:
a) Provision of a green body having the piezoceramic composition and b) heat treatment of the green body, the piezoceramic material of the component being produced from the piezoceramic composition. The green body is a formed body consisting, for example, of homogeneously mixed, compressed oxides of the specified metals. Equally, the green body can have an organic additive which is processed together with the oxides of the metals to form a slip. The organic additive is for example a binder or a dispergator. A green body is produced from the slip, in the form of a green film for example, by film drawing. The green body having the piezoceramic composition produced in the forming production process is subjected to heat treatment. The heat treatment of the green body includes calcining and/or sintering, leading to the formation and compression of the self-forming piezoceramic material. Lead oxide escapes during the compression phase. For this reason lead having a stoichiometric excess of lead of up to 0.1 (10 mol %) is added.

Thus, according to various embodiments, a lead zirconate titanate with complex B-site doping with nickel and molybdenum can be compressed at a relatively low sintering temperature. It is assumed that a eutectic phase consisting of lead oxide and molybdenum oxide ($PbO.MbO_3$) and melting at low temperature forms as an intermediary stage during the sintering process. Said eutectic phase can promote the sintering of the piezoceramic composition into the piezoceramic material (melting phases support sintering). The forming and compressing of the piezoceramic material take place at temperatures as low as 1000° C.

In principle any ratio of nickel content to molybdenum content is conceivable. In one embodiment the ratio may be n/m=1. The ratio of nickel content to molybdenum content may be essentially 1, a deviation of 10% ($0.9 \leq n/m \leq 1.1$) up to 20% being possible ($0.8 \leq n/m \leq 1.2$).

The nickel content and molybdenum content preferably may amount to 0.5·z in each case. The following may apply: n=m=0.5. Deviations of 10% up to 20% are possible in this case too. With these proportions a particularly low sintering temperature can be achieved while at the same time obtaining relatively good piezoelectric properties of the resulting piezoceramic material.

It may be particularly advantageous if an alkaline earth metal AE is present, in other words if the alkaline earth content c is not equal to 0. The presence of alkaline earth metals promotes the grain growth of the self-forming piezoceramic material. Relatively large piezoceramic grains are obtained on an average during sintering. The piezoceramic properties can be improved as a result. According to another embodiment the alkaline earth content is c: $0.005 \leq c \leq 0.1$. The alkaline earth metal is at least one metal selected from the group comprising calcium, strontium and barium. Only one type of alkaline earth metal may be present here. Multiple types of alkaline earth metals, strontium and barium for example, are also conceivable.

In the interests of achieving good piezoceramic properties a small percentage of the A-sites of the piezoceramic material may be occupied by one or more rare earth metals RE. The rare earth metal content b amounts to less than 15 mol % ($b \leq 0.15$), where b is chosen in particular from the range 0.005 to 0.15. In this case any element of the lanthanide or actinide group can be used as the rare earth metal. In a special embodiment the rare earth metal RE can be at least one metal selected from the group comprising europium, gadolinium, lanthanum, neodymium, praseodymium, promethium and samarium. With the specified low rare earth metal content c, these rare earth metals lead to a relatively high $d_{33}$ coefficient in the small-signal range (with electrical field strengths of a few V/mm) as well as in the large-signal range (with electrical field strengths of several kV/mm).

For the complex B-site doping the following may apply: x+y+z=1. It has proved particularly advantageous if in this case z is between 0.001 and 0.5 and in particular between 0.001 and 0.05. The nickel-molybdenum content is less than 5 mol %. With higher nickel-molybdenum contents, melting phases (glass phases) consisting of lead oxide and molybdenum oxide ($PbO.MoO_3$) or nickel oxide and molybdenum oxide ($NiO.MoO_3$) can occur in a considerable proportion during the sintering process.

This leads to a disruption in a structure of the self-forming piezoceramic material. This has a negative effect on the piezoelectric property values of the piezoceramic material.

In order to provide the green body having the piezoceramic composition precursors of the oxides of the metals, carbonates or oxalates for example, can be used. Preferably, however, oxides of the metals are used directly. Both types of metal compounds, which is to say the precursors of the oxides as well as the oxides themselves, can be designated as oxidic metal compounds.

In one embodiment, the green body is provided by mixing powdered, oxidic metal compounds of the metals lead, rare earth metal RE, alkaline earth metal AE, zirconium, titanium, nickel and molybdenum to produce the piezoceramic composition. In order to produce the piezoceramic material the oxidic metal compounds are used as powders. Said oxidic metal compounds are preferably lead oxide (PbO), rare earth oxides (e.g. $La_2O_3$ or $Nd_2O_3$), alkaline earth oxides (e.g. CaO or SrO), zirconium dioxide (ZrO2), titanium dioxide (TiO2), nickel oxide (NiO) and molybdenum trioxide ($MoO_3$).

The powders of the oxidic metal compounds can be produced in accordance with known methods, for example by way of precipitation reactions in accordance with the sol-gel, citrate, hydrothermal or oxalate method. In the process oxidic metal compounds can be produced having only one type of metal. It is also conceivable in particular that oxidic metal compounds having several types of metals can be used (mixed oxides). According to another embodiment, therefore, a piezoceramic composition having at least one oxidic metal compound comprising at least two of the metals is used. The oxidic metal compound comprising at least two of the metals is a zirconate titanate $(Zr,TiO_2)$ for example. In this case, too, the aforementioned precipitation reactions can be used. Also conceivable is a mixed-oxide method. In this case oxides of different metals in powder form are mixed together and calcined at higher temperatures. The mixed oxides are produced during the calcining process.

The conditioning of the metal oxides with the transformation into the piezoceramic material can take place in different ways. It is conceivable, for example, that first the powders of the oxidic metal compounds are homogeneously mixed. This results in the piezoceramic composition in the form of a homogeneous mixture of the metal oxides. Next, the piezoceramic composition is transformed into the piezoceramic material by heat treatment, e.g. by calcining. The piezoceramic material is pulverized into fine piezoceramic powder. A ceramic green body with an organic binder and further organic additives is then produced from the fine piezoceramic powder in the forming production process. This ceramic green body is debindered and sintered, the piezoceramic component having the piezoceramic material being formed in the process.

As an alternative to the approach described, the powders of the oxidic metal compounds can be homogeneously mixed and processed in the forming production process into the ceramic green body with organic binder. This green body also already has the piezoceramic composition. Subsequent sintering leads to the piezoceramic component having the piezoceramic material.

According to yet another embodiment a piezoceramic component having at least one piezoelectric element is produced which has an electrode layer comprising electrode material, at least one further electrode layer comprising a further electrode material, and at least one piezoceramic layer comprising the piezoceramic material arranged between the electrode layers. A single piezoelectric element constitutes the smallest unit of the piezoceramic component. In order to produce the piezoelectric element a ceramic green film having the piezoceramic composition is, for example, printed on both sides with the electrode materials. The electrode materials can be identical or different in this case. The piezoelectric element results by subsequent debindering and sintering.

The piezoceramic composition compresses at relatively low sintering temperatures. It is therefore possible to employ as the electrode material elementary metals which have relatively low melting temperatures. According to a special embodiment, a piezoelectric element is therefore used in which the electrode material and/or the further electrode material have at least one elementary metal selected from the group comprising silver, copper and palladium. The piezoceramic material or the piezoelectric element is produced in particular by means of a common sintering of the piezoceramic composition and the electrode materials (cofiring). In this case the electrode material can consist of the pure metals, only of silver (melting temperature approx. 960° C.), for example, or only of copper (melting temperature approx. 1080° C.). An alloy of the aforementioned metals is also possible, for example an alloy composed of silver and palladium. In particular the electrode material and/or the further electrode material have/has a palladium content which is chosen from the range from 0 weight % inclusive up to 30 weight % inclusive. Preferably the palladium content amounts to max. 20 weight %, where 0 means that virtually no palladium is present. Low palladium contents of up to 0.5 weight % are nonetheless possible. As a result of reducing the palladium content the melting temperature of the silver-palladium alloy is lowered. For example, the melting temperature of the alloy at a palladium content of 20 weight % is approximately 1100° C. Preferably the palladium content amounts to max. 5 weight % (melting temperature approximately 1000° C.). Owing to the small palladium content the costs of producing components of this type are also significantly reduced. At the same time, however, a piezoceramic material having good piezoelectric properties is attainable owing to the compressing at low temperatures.

The sintering into the piezoceramic material can be performed in a reducing or oxidizing sintering atmosphere. In a reducing sintering atmosphere practically no oxygen is present. An oxygen partial pressure amounts to less than $1·10^{-2}$ mbar and preferably less than $1·10^{-3}$ mbar. Sintering in a reducing sintering atmosphere makes inexpensive copper possible as an electrode material.

In principle any piezoceramic component can be produced with the aid of the piezoceramic composition. The piezoceramic component has primarily at least one above-described piezoelectric element. The piezoceramic component having the piezoelectric element is preferably chosen from the group comprising piezoceramic flexural transducer, piezoceramic multilayer actuator, piezoceramic transformer, piezoceramic motor and piezoceramic ultrasonic transducer. The piezoelectric element is for example part of a piezoelectric flexural transducer. A monolithic stack consisting of piezoelectric elements is produced by stacking on top of one another a plurality of green films printed on one or both sides with electrode material, subsequent debindering and sintering. Given suitable dimensioning and molding, a monolithic piezoceramic multilayer actuator results. Said piezoceramic multilayer actuator is preferably used for controlling a fuel injection valve of an internal combustion engine. Given suitable dimensioning and molding, a piezoceramic ultrasonic transducer is also attainable as a result of the stack-like arrangement of the piezoelectric elements. The ultrasonic transducer is used for example in medical engineering or for materials testing.

To sum up, the following advantages may be produced:
Owing to the complex B-site doping with nickel and molybdenum the piezoceramic composition compresses already at less than 1000° C.
Because compression takes place at lower temperatures relatively low sintering temperatures are attainable.
The low sintering temperatures open up the possibility of using metals or alloys which melt at lower temperature as electrode material in the piezoceramic component production process. Cost savings are possible compared with the prior art.
As a result of the A-site doping with the rare earth metals good piezoelectric properties are achieved in the resulting piezoceramic material.

The good piezoelectric properties can be additionally improved by means of alkaline earth ions which primarily occupy the A sites of the piezoceramic material.

Figure 4:
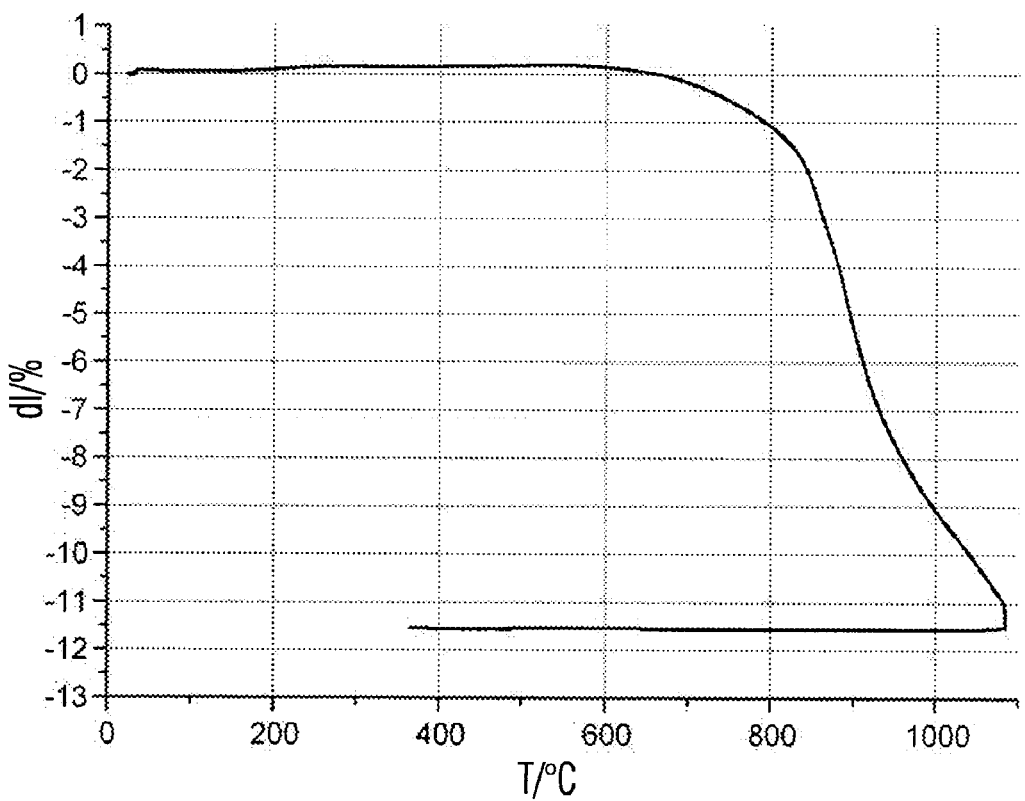
FIG. 4 shows the shrinkage behavior during the sintering of one of the piezoceramic compositions.

According to a first exemplary embodiment the piezoceramic composition I has the following nominal composition: $Pb_{1.00}Nd_{0.02}[(Zr_{0.534}Ti_{0.466})_{0.98} (Ni_{0.5}Mo_{0.5})_{0.02}]O_3$. The shrinkage behavior of this composition is illustrated in FIG. 4. A dilatometrically measured length change dl (in %) is plotted against the temperature T (in °C.). A noticeable compression takes place already at a temperature of 800° C.

A second exemplary embodiment of the piezoceramic composition II is based on the following nominal composition: $Pb_{1.00}Nd_{0.02}[(Zr_{0.515}Ti_{0.485})_{0.95}(Ni_{0.5}Mo_{0.5})_{0.05}]O_3$.

A third exemplary embodiment of the piezoceramic composition III has the following nominal composition: $Pb_{1.00}Nd_{0.02}[(Zr_{0.537}Ti_{0.463})_{0.99}(Ni_{0.5}Mo_{0.5})_{0.01}]O_3$.

In order to produce the piezoceramic compositions I, II and III corresponding proportions of powdered PbO, $Nd_2O_3$, $ZrO_2$, $TiO_2$, NiO and $MoO_3$ are homogeneously mixed together and calcined or sintered. PbO is used with an excess of 3 mol % in each case. The excess lead oxide content escapes during sintering.

As a result of the sintering a piezoceramic material is produced in each case from the piezoceramic compositions I, II and III. The piezoelectric properties of said piezoceramic material can be read from Table 1. In addition to the $d_{33}$ values, Table 1 lists in each case the average grain size (average diameters of piezoceramic grains), the Kp value (planar coupling factor), the relative permittivity $\epsilon r$ (according to the polarity of the piezoceramic material) and the Curie temperature $T_c$. The sintering process lasted two hours in each case. The sintering was performed in an oxidizing sintering atmosphere. The different values for I and I' are obtained as a result of using different sintering temperatures.

TABLE 1

|  | I | I' | II | III |
|---|---|---|---|---|
| Sintering temperature [° C.] | 1100 | 1000 | 1100 | 1100 |
| $\epsilon_r$ (according to polarity) | 1377 | 1230 | 1037 | 1540 |
| Large signal $d_{33}$ at 2 kV/mm [pm/V] | 837 | 680 | 357 | 708 |
| Large signal $d_{33}$ at 1 kV/mm [pm/V] | 833 | 662 | 358 | 693 |
| Kp [%] | 56 | 45 | 44 | 60 |
| Grain size [μm] | 5.5 | 3 | 2.5 | 4 |
| $T_{Curie}$ [° C.] | 321 | 329 | 320 | 328 |

The piezoceramic compositions I, II and II are used for producing a piezoceramic component 1. According to a first embodiment the piezoceramic component 1 is a piezoelectric actuator 1 in monolithic multilayer format. The piezoelectric actuator 1 consists of a plurality of piezoelectric elements 10 arranged one on top of the other to form a stack. Each of the piezoelectric elements 10 has an electrode layer 11, a further electrode layer 12, and a piezoceramic layer 13 disposed between the electrode layers 11 and 12. The piezoelectric elements 10 adjacent to one another in the stack each have a common electrode layer. The electrode layers 11 and 12 have an electrode material composed of a silver-palladium alloy containing the palladium in a proportion of 5 weight %. In an alternative embodiment the electrode layers consist of (approximately) pure silver. According to a further alternative the electrode material is copper.

Figure 3:
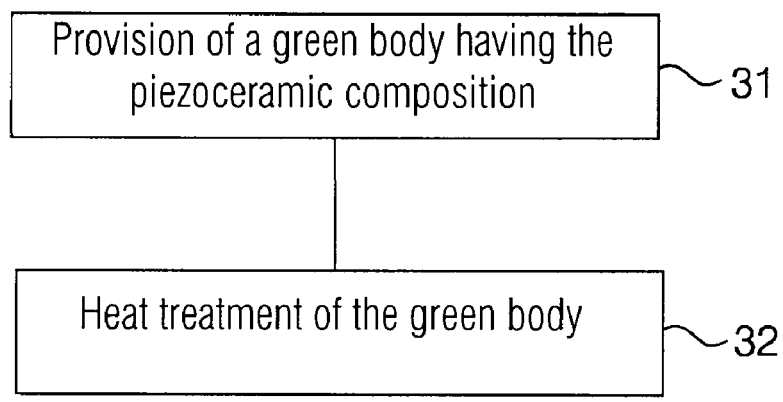
FIG. 3 shows a method for producing the piezoceramic component.

In order to produce the piezoelectric actuator 1 green bodies in the form of green films comprising the piezoceramic composition are provided (method step 31, FIG. 3). For this purpose a powder comprising the piezoceramic composition is mixed with an organic binder and further organic additives. The ceramic green films are cast from the slip obtained in this way. The green films are dried, printed with a paste containing the electrode material, stacked on top of one another, laminated, debindered and sintered to form the piezoelectric actuator 1 under an oxidizing sintering atmosphere (silver or silver-palladium alloy as the electrode material) or a reducing sintering atmosphere (copper as the electrode material) (method step 32, FIG. 3).

The resulting monolithic piezoceramic multilayer actuator is used for actuating a fuel injection valve of an internal combustion engine of a motor vehicle.

Further embodiments (not shown) such as a piezoceramic flexural transducer, piezoceramic transformer or piezoceramic ultrasonic transducer are also obtainable with the aid of the novel piezoceramic composition.

What is claimed is:
1. A piezoceramic composition comprising a calculated empirical formula $Pb_{1-a}RE_bAE_c[Zr_xTi_y(Ni_nMo_m)_z]O_3$, wherein
RE is a rare earth metal with a rare earth metal content b,
AE is an alkaline earth metal with an alkaline earth metal content c,
nickel is present with a nickel content n.z,
molybdenum is present with a molybdenum content m.z, and
wherein:

$a<1$;

$0 \leq b \leq 0.15$;

$0 \leq c \leq 0.5$;

$n>0$;

$m>0$;

$0.1 \leq n/m \leq 5$;

$X>0$;

$Y>0$;

$Z>0$;

$x+y+z=1$.

2. The piezoceramic composition according to claim 1, wherein: $0.5 \leq n/m \leq 2$.

3. The piezoceramic composition according to claim 1, wherein: $n/m=1$.

4. The piezoceramic composition according to claim 3, wherein: $n=m=0.5$.

5. The piezoceramic composition according to claim 1, wherein: $0.005 \leq c \leq 0.1$.

6. The piezoceramic composition according to claim 1, wherein: $0.005<b<0.15$.

7. The piezoceramic composition according to claim 1, wherein: $0.001 \leq z \leq 0.5$.

8. The piezoceramic composition according to claim 7, wherein: $0.001 \leq z \leq 0.05$.

9. The piezoceramic composition according to claim 1, wherein the rare earth metal RE is at least one metal selected from the group consisting of europium, gadolinium, lanthanum, neodymium, praseodymium, promethium and samarium.

10. The piezoceramic composition according to claim 1, wherein the alkaline earth metal AE is at least one metal selected from the group consisting of calcium, strontium and barium.

\* \* \* \* \*